(12) United States Patent
Anzel et al.

(10) Patent No.: US 8,349,137 B2
(45) Date of Patent: Jan. 8, 2013

(54) DEVICE FOR DEWATERING A MATERIAL WEB

(75) Inventors: Andreas Anzel, Graz (AT); Mario Wiltsche, Graz (AT)

(73) Assignee: Andritz AG, Graz (AT)

( * ) Notice: Subject to any disclaimer, the term of this patent is extended or adjusted under 35 U.S.C. 154(b) by 45 days.

(21) Appl. No.: 12/735,275

(22) PCT Filed: Dec. 29, 2008

(86) PCT No.: PCT/AT2008/000477
§ 371 (c)(1),
(2), (4) Date: Nov. 10, 2010

(87) PCT Pub. No.: WO2009/086573
PCT Pub. Date: Jul. 16, 2009

(65) Prior Publication Data
US 2011/0056641 A1   Mar. 10, 2011

(30) Foreign Application Priority Data
Jan. 9, 2008   (AT) .................................. A 25/2008

(51) Int. Cl.
*D21F 3/02* (2006.01)
(52) U.S. Cl. ...................... 162/358.1; 162/348; 162/361; 162/363; 162/900
(58) Field of Classification Search .......... 162/301–306, 162/348, 358.1–358.5, 362–364, 367–368, 162/900–903
See application file for complete search history.

(56) References Cited

U.S. PATENT DOCUMENTS

| | | | | |
|---|---|---|---|---|
| 4,976,820 A * | 12/1990 | Laapotti | ......................... | 162/206 |
| 6,287,426 B1 * | 9/2001 | Edwards et al. | .............. | 162/281 |
| 6,736,939 B2 * | 5/2004 | Watanabe | .................. | 162/358.3 |
| 7,294,237 B2 * | 11/2007 | Herman et al. | ............... | 162/358.3 |
| 7,351,307 B2 * | 4/2008 | Scherb et al. | ................. | 162/115 |
| 7,387,706 B2 * | 6/2008 | Herman et al. | ............... | 162/203 |
| 7,476,293 B2 * | 1/2009 | Herman et al. | ............... | 162/206 |
| 7,510,631 B2 * | 3/2009 | Scherb et al. | ............... | 162/358.1 |
| 7,527,709 B2 * | 5/2009 | Lippi Alves Fernandes et al. | ........................... | 162/358.4 |
| 7,582,187 B2 * | 9/2009 | Scherb et al. | ................. | 162/112 |
| 7,585,395 B2 * | 9/2009 | Quigley et al. | ............ | 162/358.4 |
| 7,850,820 B2 * | 12/2010 | Scherb et al. | ................. | 162/117 |
| 7,976,683 B2 * | 7/2011 | Scherb | ........................ | 162/358.1 |
| 2002/0053415 A1 * | 5/2002 | Meschenmoser | .......... | 162/358.1 |
| 2002/0096302 A1 * | 7/2002 | Thoroe Scherb et al. | .. | 162/358.1 |
| 2004/0094282 A1 * | 5/2004 | Danzler | ..................... | 162/358.3 |
| 2004/0154776 A1 * | 8/2004 | Inoue | ......................... | 162/358.1 |
| 2004/0185729 A1 * | 9/2004 | Inoue | ........................... | 442/118 |
| 2005/0167066 A1 * | 8/2005 | Herman et al. | ............... | 162/203 |
| 2005/0167068 A1 * | 8/2005 | Herman et al. | ............ | 162/358.1 |
| 2005/0211533 A1 * | 9/2005 | Ishino et al. | .................. | 198/846 |

(Continued)

*Primary Examiner* — Jose A Fortuna
(74) *Attorney, Agent, or Firm* — Alix, Yale & Ristas, LLP

(57) ABSTRACT

This invention relates to a dewatering device for dewatering a material web (5), particularly a tissue web, in a paper machine where the dewatering device is placed after a forming unit (16) and before a thermal drying device (11). The dewatering device consists of a press roll (1) with a press belt (3) running round it. Here, the material web (5) is carried into the dewatering device either on a water-absorbing belt (4) or on a wire (10). The water-absorbing belt (4) is placed in the dewatering device between the material web (5) and the press belt (3). This invention also relates to a dewatering process performed with the dewatering device.

11 Claims, 2 Drawing Sheets

U.S. PATENT DOCUMENTS

Figure 1:
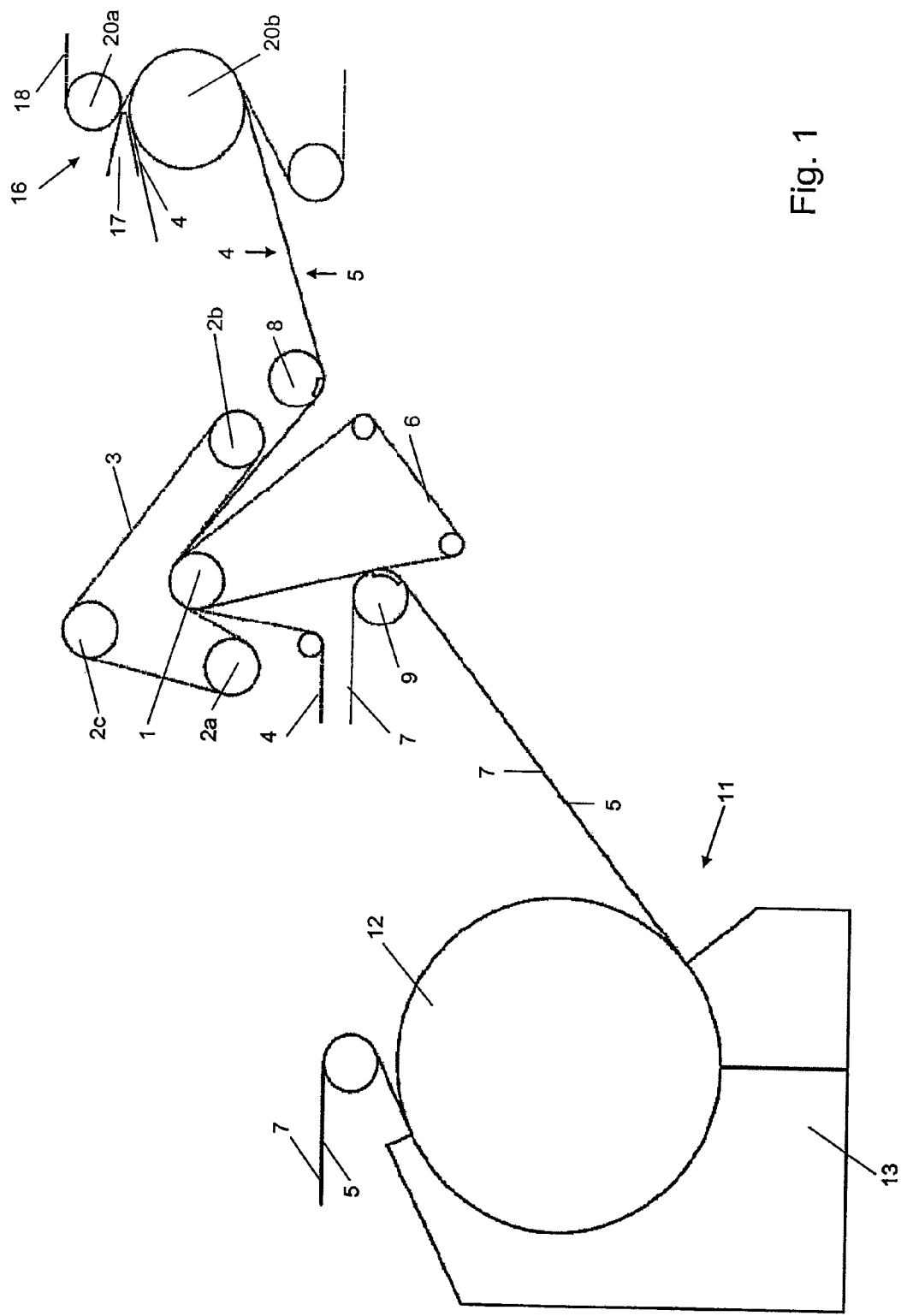

| | | | |
|---|---|---|---|
| 2005/0251976 A1* | 11/2005 | Lipponen et al. | 28/100 |
| 2006/0085998 A1* | 4/2006 | Herman et al. | 34/453 |
| 2006/0085999 A1* | 4/2006 | Scherb et al. | 34/453 |
| 2006/0086473 A1* | 4/2006 | Herman et al. | 162/358.2 |
| 2006/0225300 A1* | 10/2006 | Herman et al. | 34/114 |
| 2007/0029061 A1* | 2/2007 | Scherb et al. | 162/289 |
| 2007/0062657 A1* | 3/2007 | Scherb et al. | 162/117 |
| 2007/0068645 A1* | 3/2007 | Silva | 162/289 |
| 2007/0074837 A1* | 4/2007 | Scherb et al. | 162/205 |
| 2007/0240842 A1* | 10/2007 | Scherb et al. | 162/205 |
| 2007/0272385 A1* | 11/2007 | Quigley et al. | 162/267 |
| 2008/0128104 A1* | 6/2008 | Scherb et al. | 162/358.2 |
| 2008/0196855 A1* | 8/2008 | Herman et al. | 162/205 |
| 2008/0210397 A1* | 9/2008 | Scherb et al. | 162/205 |
| 2008/0251227 A1* | 10/2008 | Scherb et al. | 162/357 |
| 2009/0165980 A1* | 7/2009 | Scherb et al. | 162/210 |
| 2009/0205797 A1* | 8/2009 | Fernandes et al. | 162/203 |
| 2009/0242158 A1* | 10/2009 | Scherb et al. | 162/283 |
| 2011/0056641 A1* | 3/2011 | Anzel et al. | 162/205 |
| 2011/0303379 A1* | 12/2011 | Boechat et al. | 162/205 |

* cited by examiner

DEVICE FOR DEWATERING A MATERIAL WEB

This invention relates to a dewatering device for dewatering a material web, particularly a tissue web, in a paper machine where the dewatering device is placed after a forming unit and before a thermal drying device, for example a TAD drum or a yankee. The dewatering device consists of a press roll with a press belt running round it, where the material web is carried into the dewatering device on a water-absorbing belt and the water-absorbing belt is arranged between the material web and the press belt. This invention also relates to a dewatering process performed with the dewatering device.

In order to produce high-quality tissue grades it is particularly important to apply gentle mechanical dewatering. Tissue is the collective term for a large number of paper grades. It includes, among others, the household hygiene sector, containing such products as facial wipes, paper handkerchiefs, napkins, toilet tissue, and kitchen roll. High-quality tissue grades are characterised by a sheet structure that is not too highly compacted and thus have a high specific volume or "bulk". This results in such positive properties as greater softness, greater water absorption capacity, and higher water absorption speed, for example.

The paper must not be compressed too much at any time in the production process as this would compact the sheet structure too much. At the same time, however, mechanical dewatering by pressing is the most economical means of sheet dewatering. Thus, the problem to be solved is how to achieve a high degree of dewatering in a process that is also gentle.

One possible means of producing high-quality tissue paper is a process that uses through-air drying (TAD), for example. Here, the paper is formed first of all in a wet end and is then further dewatered by a vacuum applied to a suction device. This is followed by initial thermal drying, where the sheet is dried by hot air passing through it in a through-air dryer. After this through-air drying (TAD) process, the sheet is placed gently on a dryer (e.g. a yankee), where it is dried further—possibly assisted by a dryer hood—and finally, it is removed from the yankee (creping). Well-known products produced in this way are, for example, Bounty® and Charmin®.

Other plants and process for the production of high-quality tissue grades do without a TAD drum. Dewatering before thermal drying by a dryer (yankee) with dryer hood is achieved using vacuum, possibly assisted by hot air or hot steam. Concepts of this kind are described in EP 1294982 A2, for example.

Substitution of mechanical dewatering by vacuum dewatering usually requires a very high vacuum and the drynesses obtainable are well below the levels that can be achieved with conventional dewatering on presses.

DE 10 2004 052 157 A1 describes a press in a machine for production of a material web including a roll with a press belt, a supporting belt and a water drainage belt running round it over the shell surface, where the water drainage belt is located on the inside in contact with the roll shell surface. Here, the pulp web preferably undergoes through-air drying, where the air passes through the press belt first of all, then the supporting belt, then through the pulp web, and finally through the water drainage belt. Placing the water drainage belt on the inside on the roll shell surface has the disadvantage that the centrifugal forces, which act outwards, hamper dewatering.

EP 1 518 960 A1 discloses a tissue machine with a pressing device consisting of a press roll to which suction is applied and a press belt, where the material web is transferred directly from the press roll to the yankee dryer.

US 2007/0272385 A1 discloses a paper machine with a dewatering device that has a permeable press belt and a vacuum roll with the permeable press belt running round it. Here, the pulp web is carried through the dewatering device on a permeable, structured belt.

EP 1 852 551 A1 discloses a dewatering device for a pulp web, where the pulp web is carried on a guide belt, beginning at a headbox, through the dewatering device to a large dryer, particularly a yankee dryer.

EP 0 289 477 A2 discloses a dewatering device for a pulp web, where the pulp web is pressed between two rolls, one of which is heated, and where the pulp web is also pressed against the heated roll by a press belt.

The problem thus addressed by the present invention is a dewatering device and a dewatering process that allow improved mechanical dewatering of a material web in a paper machine for production of tissue paper grades with a high specific volume.

This task is resolved by a dewatering device in which a transfer belt that carries the material web onward after dewatering is arranged between the material web and the press roll.

An arrangement of this kind has the advantage that the material web is separated from the water-absorbing belt directly after pressing and is carried onward on the transfer belt. This arrangement prevents any re-wetting of the material web by the water held in the water-absorbing belt.

Due to this arrangement of the water-absorbing belt on the outside at the paper web, the centrifugal forces acting in the deflection zone assist dewatering of the material web, i.e. moisture is removed from the material belt in radial direction outwards towards the water-absorbing belt.#

The press belt is preferably water-impermeable and air-tight. As a result the press belt is very resilient and can thus be used to apply higher pressing forces. The press belt is made preferably of metal. With this design, through-air drying is dispensed with in the dewatering device according to the invention and dewatering is effected by purely mechanical means.

It is advantageous if the water-absorbing belt is a felt because felts have particularly high water absorption capacity and are widely used in paper production. Of course, it is also conceivable to have several water-absorbing belts or felts running through the pressing zone between the material web and the press belt.

The thermal drying equipment after the dewatering device is preferably a through-air dryer (TAD), i.e. a TAD drum, or a yankee. It is also conceivable that these two units are arranged consecutively. These drying systems are already widespread in tissue production, thus existing plants can be improved with little effort by installing a dewatering device according to the invention before these thermal drying units.

It is advantageous if suction is applied to the press roll in the outlet zone as this allows the water-absorbing belt to be lifted off the material web easily after dewatering.

The invention also relates to a corresponding process for dewatering a material web, particularly a tissue web, in a paper machine where the material web is fed through a press zone located after a forming unit and before a thermal drying device, where the press zone is formed by at least one press belt running round the shell surface of a press roll, where the material web is carried through the press zone either on a water-absorbing belt, and where the water-absorbing belt runs through the press zone between the material web and the at least one press belt. A transfer belt is carried through the press zone between the press roll and the material web, where first of all the press belt and then the water-absorbing belt is lifted off the material web at the end of the wrap zone, with the material web being carried onward on the transfer belt.

An arrangement of this kind facilitates onward transport of the material web after the press zone.

Due to the arrangement of the water-absorbing belt, which can, in particular, be a felt, on the outside on the paper web, the centrifugal forces acting due to deflection assist dewatering of the material web. Thus, dewatering takes place radially outwards from the material web to the water-absorbing belt.

It is favourable here if the material web is formed on the water-absorbing belt, which can, in particular, be a felt. This provides for a particularly simple set-up because the material web is conveyed on one belt from the headbox as far as the press zone.

It is useful to apply suction to the press roll as this makes it easy to separate the water-absorbing belt from the material web.

Figure 2:
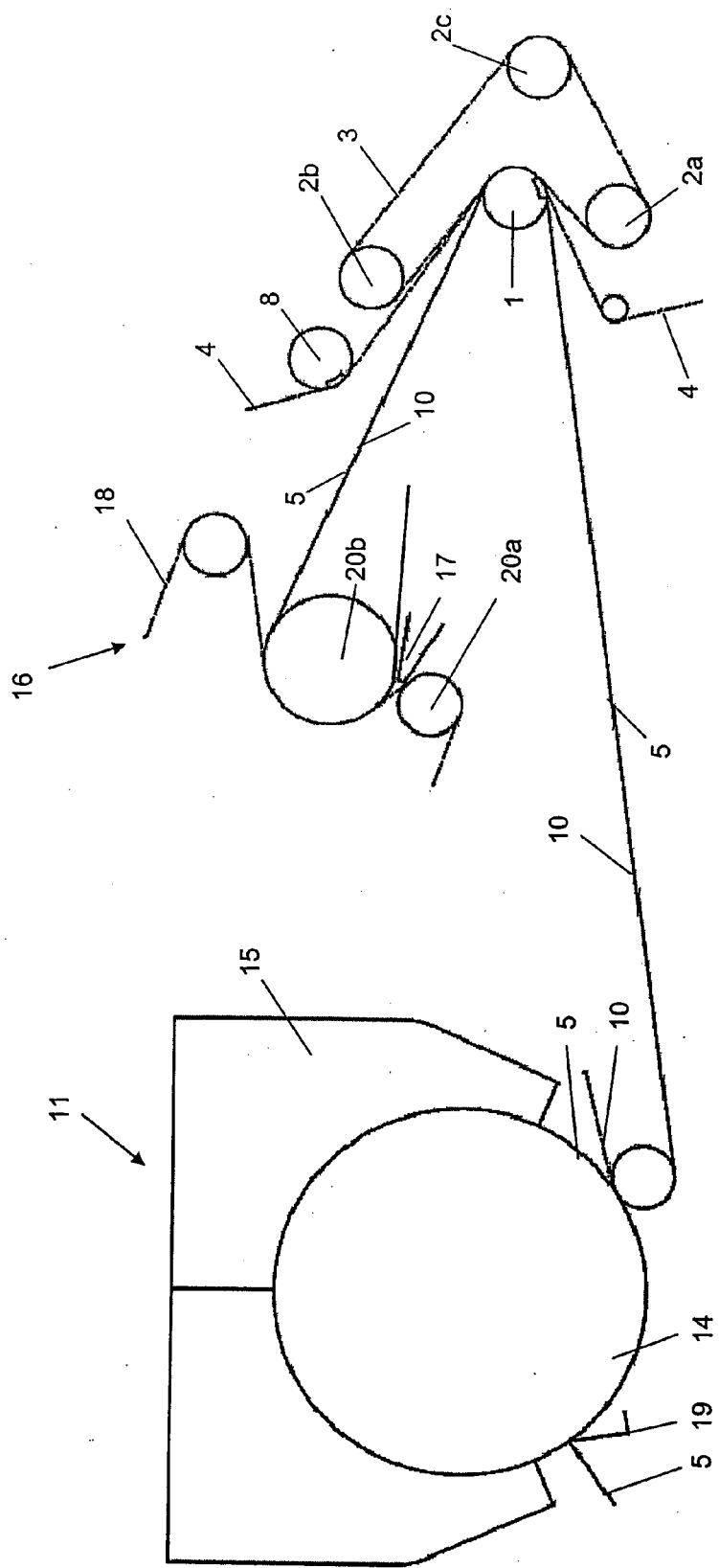

In the following, two embodiments of the invention are described on the basis of drawings. Here, FIG. 1 shows a schematic side view of a dewatering device according to the invention, FIG. 2 shows a schematic side view of a further variant of a dewatering device according to the invention;

The dewatering device according to the invention is shown in FIG. 1. It comprises a press roll 1 with at least one press belt 3 running round it. further—possibly assisted by a dryer hood—and finally, it is removed from the yankee (creping). Well-known products produced in this way are, for example, Bounty® and Charmin®.

Other plants and process for the production of high-quality tissue grades do without a TAD drum. Dewatering before thermal drying by a dryer (yankee) with dryer hood is achieved using vacuum, possibly assisted by hot air or hot steam. Concepts of this kind are described in EP 1294982 A2, for example.

Substitution of mechanical dewatering by vacuum dewatering usually requires a very high vacuum and the drynesses obtainable are well below the levels that can be achieved with conventional dewatering on presses.

DE 10 2004 052 157 A1 describes a press in a machine for production of a material web including a roll with a press belt, a supporting belt and a water drainage belt running round it over the shell surface, where the water drainage belt is located on the inside in contact with the roll shell surface. Here, the pulp web preferably undergoes through-air drying, where the air passes through the press belt first of all, then the supporting belt, then through the pulp web, and finally through the water drainage belt. Placing the water drainage belt on the inside on the roll shell surface has the disadvantage that the centrifugal forces, which act outwards, hamper dewatering.

The problem thus addressed by the present invention is a dewatering device and a dewatering process that allow improved mechanical dewatering of a material web in a paper machine for production of tissue paper grades with a high specific volume.

This problem is solved by a dewatering device in which a water-absorbing belt is provided between the material web to be dewatered and the press belt.

Due to this arrangement of the water-absorbing belt on the outside at the paper web, the centrifugal forces acting in the deflection zone assist dewatering of the The invention also relates to a corresponding process for dewatering a material web, particularly a tissue web, in a paper machine where the material web is fed through a press zone located after a forming unit and before a thermal drying device, where the press zone is formed by at least one press belt running round the shell surface of a press roll, where the material web is carried through the press zone either on a water-absorbing belt or a wire, and where a water-absorbing belt runs through the press zone between the material web and the at least one press belt.

Due to the arrangement of the water-absorbing belt, which can in particular, be a felt, on the outside on the paper web, the centrifugal forces acting due to deflection assist dewatering of the material web. Thus, dewatering takes place radially outwards from the material web to the water-absorbing belt.

In an advantageous embodiment of the dewatering process, a transfer belt runs through the press zone between the press roll and the material web. An arrangement of this kind facilitates onward transport of the material web after the press zone.

Here, it is an advantage if the press belt is lifted off the material web first of all and then the water-absorbing belt, at the end of contact with the roll, with the material web being conveyed onwards on the transfer belt.

It is favourable here if the material web is formed on the water-absorbing belt, which can, in particular, be a felt. This provides for a particularly simple set-up because the material web is conveyed on one belt from the headbox as far as the press zone.

In a favourable embodiment of the dewatering process the material web is conveyed through the press zone on a wire, and, at the end of contact with the roll, first of all the press belt and then the water-absorbing belt are lifted off the material web, with the material web being transported onwards on the wire. Here the press belt 3 runs over three guide rolls 2a, 2b, and 2c. The guide rolls 2a, 2b, and 2c are located on the inside in the revolving press belt 3.

The dewatering device is preceded by a forming unit 16, in which the material web 5 is formed. The forming unit 16 generally consists of a headbox 17, from which a pulp suspension exits between a breast roll 20a and a forming roll 20b, where an outer wire 18 runs round the breast roll 20a. In the forming unit 16 the pulp suspension is dewatered to the extent that a material web 5 forms on the water-absorbing belt 4. This water absorbing belt 4 is preferably a felt that is dewatered by a suction device 8 before entering the dewatering device according to the invention. The suction device 8 is designed here, by way of example, as a roll to which suction is applied, with the water-absorbing belt 4 running over part of this roll.

The material web 5 runs on the water-absorbing belt 4 through the press zone of the dewatering device, and in such a way that the water-absorbing belt 4 is placed between the press belt 3 and the material web 5. Deflection of the material web 5 in the press zone generates centrifugal forces that favour the transfer of water from the material web 5 to the water-absorbing belt 4. The press belt 3 and the water-absorbing belt 4 do not come into contact with one another until they reach the press inlet, i.e. the water-absorbing belt 4 does not run over the guide roll 2b on the inlet side.

The press belt 3 permits transfer of belt tensions up to 80 N/mm$^2$ and more. The press belt can be designed as a metal strip. The pressing force acting on the material web 5 is greater than 0.8 bar, preferably greater than 1.5 bar. In the embodiment shown, the press belt 3 is water-impermeable and airtight, thus through-air flow is not provided. Other embodiments are also conceivable, however, where through-air flow does take place in additional to mechanical dewatering in the press zone.

The pressing force applied by the press belt 3 to the water-absorbing belt 4 and subsequently to the material web 5 results from the press belt tension selected and the diameter of the press roll 1. At constant press belt tension the pressing force is higher with a small roll diameter, where the dwell time of the material web 5 in the press zone is shorter at the given material web speed. An increase in the press belt tension generally increases the effective pressing force.

In addition to the water-absorbing belt 4 and the material web 5, a transfer belt 6 also runs through the press zone of the dewatering device. The material web 5 is transferred to this transfer belt 6 immediately after the press zone. This transfer of the web prevents re-wetting of the material web 5. The water-absorbing belt 4 should be lifted off the material web 5 as quickly as possible in order to keep re-wetting of the material web 5 to a minimum, and as slowly as necessary to allow onward transport of the material web 5 on the transfer belt 6.

Suction can be applied to the press roll 1 in the outlet zone, which facilitates lifting of the water-absorbing belt 4 off the material web 5 after the press zone.

The press roll 1 can have a structured surface, e.g. grooves, as this would enhance the running properties of the transfer belt 6 on the press roll 1.

After the dewatering device the material web 5 is removed from the transfer belt 6 by a roll 9 to which suction is applied and transferred to a wire 7. The wire 7 can also have a structured surface. In order to facilitate transfer of the material web 5 from the transfer belt 6 to the wire 7, the wire 7 can run at higher speed than the transfer belt 6 and thus exert tension on the material web 5.

The wire 7 conveys the material web 5 onward to a thermal drying unit 11, comprising a TAD drum 12 and a TAD hood 13. In other embodiments, the thermal drying unit 11 after the dewatering device can also consist of a yankee complete with dryer hood.

It would also be conceivable to transfer the material web 5 from the wire 7 to subsequent wires. Here, the wires may run intentionally at different speeds. If a subsequent wire runs more slowly than the preceding one, this will lead to compression of the material web 5 and thus to an increase in volume (greater bulk).

FIG. 2 shows a further embodiment of the invention, using the same reference numerals as in FIG. 1. In this embodiment, however, the material web 5 is conveyed through the dewatering device on a wire 10.

Formation of the material web from a suspension also takes place on the wire 10 in the forming unit 16 before the press unit. This wire 10 can also be a TAD wire.

The water-absorbing belt 4 is dewatered by a suction unit 8 before the dewatering device and does not come into contact with the material web 5 until afterwards, directly in front of the press zone.

In the press zone the water-absorbing belt 4 runs between the press belt 3 and the material web 5.

After the press zone the press belt 3 is lifted off the water-absorbing belt 4 first of all, then the water-absorbing belt 4 is lifted off the material web 5 and the material web 5 is carried onward on the wire 10.

Suction is applied to the press roll 1 in the outlet zone. This helps to separate the water-absorbing belt 4 from the material web 5.

After the dewatering device the material web 5 is brought to a thermal drying device 11, in the present case comprising a yankee 14 and a hood 15. A creping doctor 19 scrapes the dried material web 5 off the yankee 14.

Of course, a TAD drum 12 with a TAD hood 13 can also be provided in place of the yankee 14.

Typically, the dried material web 5 has a basis weight of 40 $g/m^2$ and less. This value is typical of tissue.

The embodiments shown in the drawings only show one preferred embodiment of the invention. The invention also comprises other embodiments in which, for example, further water-absorbing belts run through the press zone in addition to the water-absorbing belt 4.

The invention claimed is:

1. A device for dewatering a material web (5) in a paper making machine after a web forming unit (16) and before a web thermal drying unit (11), comprising:
   a press belt (3) wrapping partly around and urged toward a press roll (1) to form a press zone at the press roll;
   said material web (5), carried into the dewatering device on a water-absorbing belt (4) arranged between the material web (5) and the press belt (3);
   a transfer belt (6) provided between the material web (5) and the press roll (1), on which transfer belt the material web (5) is carried after leaving the dewatering device; whereby
   the press belt (3) applies a direct pressing force to the water absorbing belt (4) and indirect force to the material web (5) in dependence on tension in the press belt and the diameter of the press roll (1) and,
   dewatering takes place radially outward of the press roll (1), from the material web (5) to the water absorbing belt (4).

2. The dewatering device according to claim 1, wherein the press belt (3) is water-impermeable and air-tight.

3. The dewatering device according to claim 2, wherein the press belt (3) is made of metal.

4. The dewatering device according to claim 2, wherein the water-absorbing belt (4) is a felt.

5. The dewatering device according to claim 1, wherein the press belt (3) is made of metal.

6. The dewatering device according to claim 5 wherein the press roll has an outlet zone immediately following the press zone, and suction is applied to the press roll (1) in the outlet-zone.

7. The dewatering device according to claim 1, wherein the water-absorbing belt (4) is a felt.

8. The dewatering device according to claim 7, wherein the press roll has an outlet zone immediately following the press zone, and suction is applied to the press roll (1) in the outlet zone.

9. The dewatering device according to claim 1, wherein the press roll has an outlet zone immediately following the press zone, and suction is applied to the press roll (1) in the outlet zone.

10. The dewatering device according to claim 1, wherein the material web is carried into the dewatering device on a water absorbing belt and this same water absorbing belt is provided between the material web and the press belt.

11. The dewatering device according to claim 1, wherein the material web is carried into the dewatering device on a wire and a separate, water absorbing belt is provided between the material web and the press belt.

* * * * *